United States Patent [19]

Shigehara et al.

[11] Patent Number: 5,220,205
[45] Date of Patent: Jun. 15, 1993

[54] OUTPUT CIRCUIT OF AN INTEGRATED CIRCUIT HAVING IMMUNITY TO POWER SOURCE FLUCTUATIONS

[75] Inventors: Hiroshi Shigehara, Tokyo; Masanori Kinugasa, Yokohama, both of Japan

[73] Assignee: Kabushiki Kaisha Toshiba, Kawasaki, Japan

[21] Appl. No.: 808,921

[22] Filed: Dec. 18, 1991

[30] Foreign Application Priority Data

Dec. 19, 1990 [JP] Japan ................. 2-403936

[51] Int. Cl.$^5$ ............... H03K 3/283; H03K 17/16; H03K 19/094
[52] U.S. Cl. ................. 307/272.2; 307/443; 307/451
[58] Field of Search ............ 307/272.2, 290, 443, 307/451, 475, 542, 594, 597

[56] References Cited

U.S. PATENT DOCUMENTS

| | | | |
|---|---|---|---|
| 4,437,024 | 3/1984 | Wacyk | 307/594 |
| 4,612,466 | 9/1986 | Stewart | 307/443 |
| 4,760,283 | 7/1988 | Weaver | 307/443 |
| 4,806,786 | 2/1989 | Valentine | 307/451 |
| 4,880,997 | 11/1989 | Steele | 307/451 |

FOREIGN PATENT DOCUMENTS 63-132523  4/1988  Japan ................. 307/443

Primary Examiner—David R. Hudspeth
Assistant Examiner—Benjamin D. Driscoll
Attorney, Agent, or Firm—Finnegan, Henderson, Farabow, Garrett & Dunner

[57] ABSTRACT

A series circuit of two P-channel transistors and a series circuit of two N-channel transistors are used respectively as a latch circuit which temporarily latches an input signal until the power source fluctuation caused by the change of the output signal is suppressed. The gates of the transistors of the two series-circuits are supplied with the output signal of an output-stage circuit and a delayed output signal obtained by delaying the above output signal so that either one of the two series-circuits can be controlled to be turned on so as to temporarily latch an input signal in a dynamic manner until the power source fluctuation is suppressed. Since the gate signals to the transistors of the two series-circuits are directly supplied without being passed through single-channel type transfer gates, a sufficiently large bias voltages are supplied to the gate of the latch circuits even under the low power source voltage. Thus, the output circuit capable of providing a desired operation characteristic even under the low operation voltage can be realized.

9 Claims, 5 Drawing Sheets

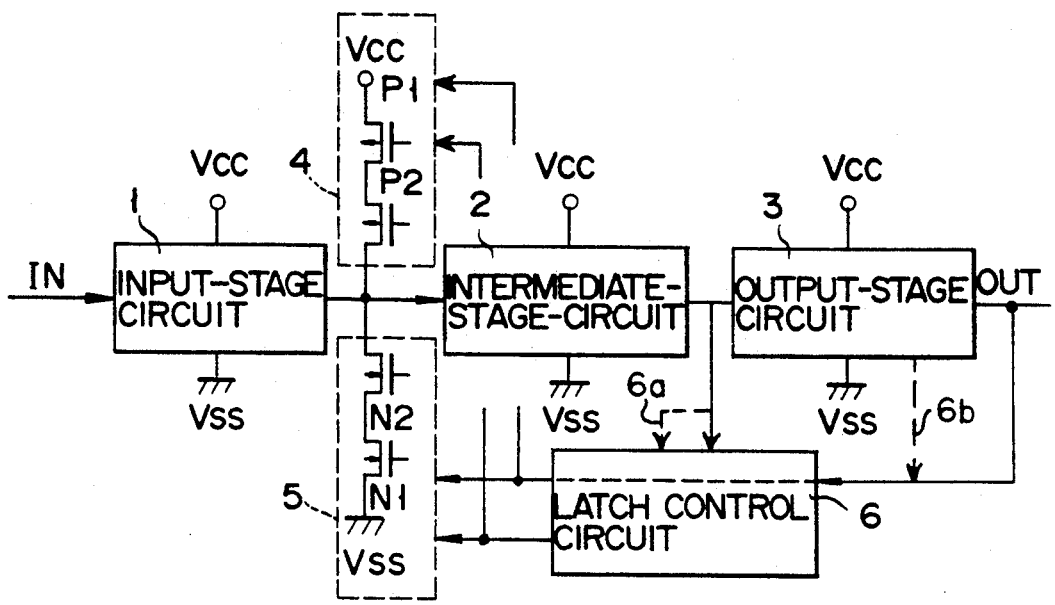
F I G. 4
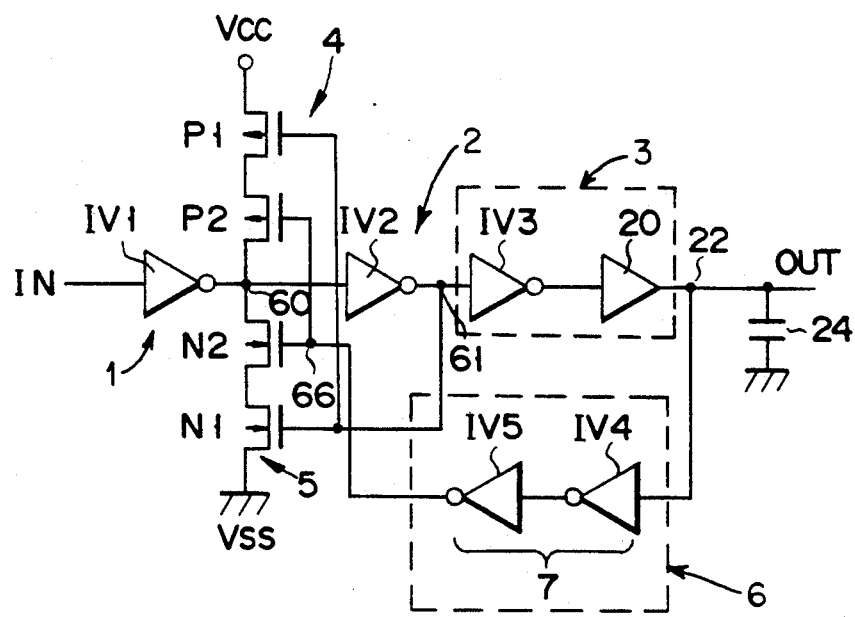
F I G. 5

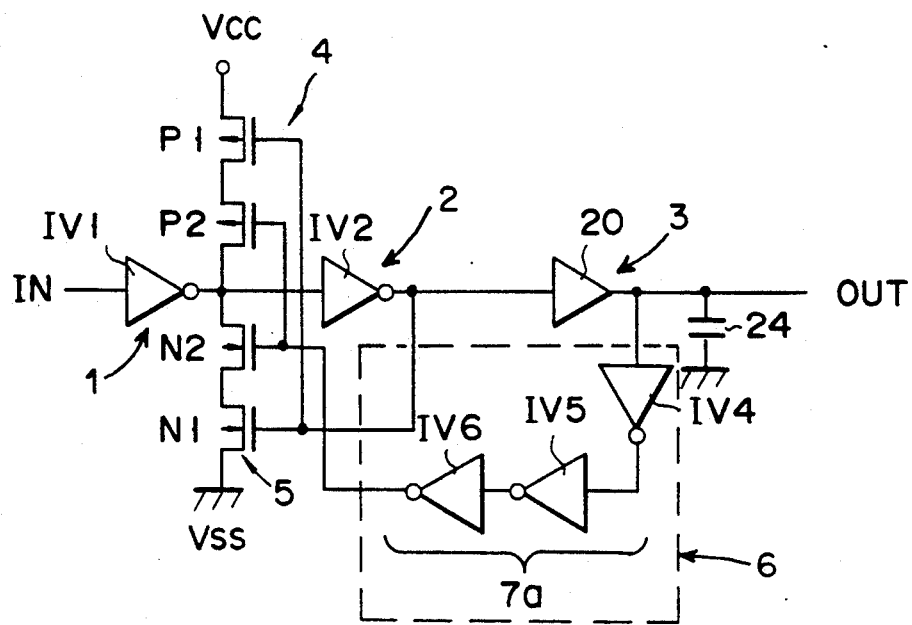
F I G. 7
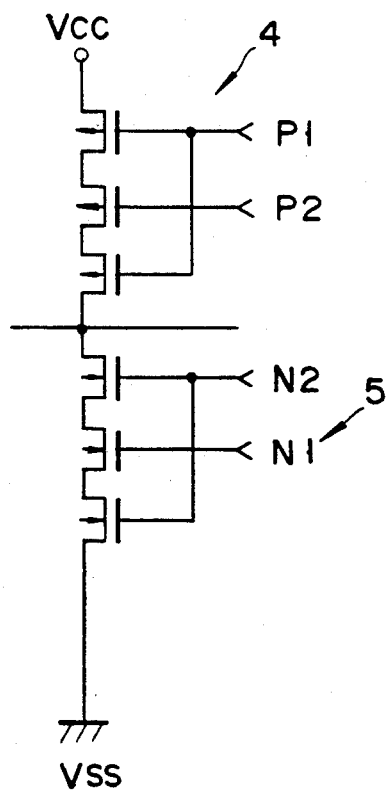
F I G. 8
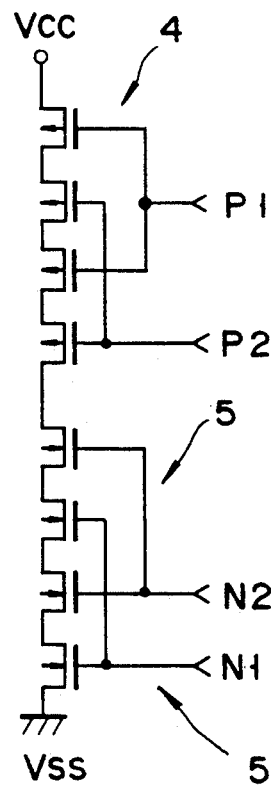
F I G. 9

OUTPUT CIRCUIT OF AN INTEGRATED CIRCUIT HAVING IMMUNITY TO POWER SOURCE FLUCTUATIONS

BACKGROUND OF THE INVENTION

1. Field of the Invention

The present invention relates to a semiconductor integrated circuit and, more particularly, to an output circuit of CMOS (complementary insulated gate type) structure having a latch circuit for temporarily latching an input signal until fluctuations in the power source voltage caused at the time of a change of an output signal are suppressed.

2. Description of the Related Art

Fluctuations in potentials of the power source and ground lines of an integrated circuit are caused when outputs of the integrated circuit are changed. The influence upon the threshold voltage of an input circuit by such fluctuations becomes larger as an operation speed of the integrated circuit is increased and the driving capability thereof is also increased. More particularly, since the operation speed of the integrated circuit is increased, an abrupt variation in the voltage across the inductances of the power source and ground lines may occur when an abrupt variation in the output current occurs at the times of rise and fall of the output signal. As a result, the potential fluctuation between the power source and ground lines (referred to as "power source fluctuation" hereinafter) may cause an erroneous operation or an oscillation in the integrated circuit.

As a countermeasure for the above drawback, it has been proposed to use a Schmitt circuit in which a hysteresis voltage width is set to include when the influence upon the input signal owing to the power source fluctuation may be expected. As another countermeasure, a technique of latching an input signal until the power source fluctuation is suppressed has also been proposed, like circuits shown in FIGS. 1 and 3 (Japanese Patent Disclosure No. 63-132523 "INTEGRATED CIRCUIT").

FIG. 1 is a circuit diagram showing an arrangement of the conventional output circuit using a latch circuit. In FIG. 1, reference numeral 14 denotes a first inverter circuit for inverting an input signal; 16, a second inverter circuit for inverting an output signal of the first inverter circuit 14; 18, a third inverter circuit for inverting an output signal of the second inverter circuit 16; 20, an output buffer circuit for buffer-amplifying an output signal of the third inverter circuit 18 and outputting the same to an output terminal 22; 24, an equivalent capacitor on the output terminal side; and 27, a feedback control delay circuit for delaying an output signal of the output buffer circuit 20 by a predetermined period of time. The delay circuit 27 is constructed by three series-connected inverters 28, 30 and 32. Each of the above circuits is supplied with a power source potential ($V_{cc}$ potential) and a ground potential ($V_{ss}$ potential) as operation power source voltages.

Further, reference numeral 40 denotes a P-channel transistor connected between the $V_{cc}$ potential and the output terminal of the first inverter circuit 14; 38, a P-channel transistor connected between the $V_{cc}$ potential and the gate of the P-channel transistor 40; 34, a third P-channel transistor connected between the gate of the P-channel transistor 40 and the output terminal of the second inverter circuit 16; 44, an N-channel transistor connected between the output terminal of the first inverter circuit 14 and the $V_{ss}$ potential; 42, an N-channel transistor connected between the gate of the N-channel transistor 44 and the $V_{ss}$ potential; and 36, an N-channel transistor connected between the gate of the N-channel transistor 44 and the output terminal of the second inverter circuit 16. The gates of the P-channel transistor 38 and N-channel transistor 42 are supplied with an output of the delay circuit 27. The gates of the P-channel transistor 34 and N-channel transistor 36 are supplied with an output of the second-stage inverter 30. The output of the inverter 30 is an inverted signal of an output of the delay circuit 27.

The operation principle of the above output circuit is described in detail in Japanese Patent Disclosure No. 63-132523, but is explained briefly hereinafter.

FIG. 2 is an operation waveform diagram for illustrating the operation of the output circuit of FIG. 1. An input signal IN is supplied from the internal circuit of either a different integrated circuit or the same integrated circuit. Assuming now that the input signal IN is changed from the low level "L" to the high level "H" (FIG. 2A), for example, then the output of the first inverter circuit 14, i.e., potential of a node 60 is inverted from "H" to "L" (FIG. 2B). As a result, the output of the second inverter circuit 16, i.e., potential of a node 61 is inverted from "L" to "H" (FIG. 2C) and the output of the third inverter circuit 18 is inverted from "H" to "L". Therefore, the output of the output buffer circuit 20, i.e., potential of the output terminal 22 is inverted from "H" to "L", and thus the inverted level "L" of the input signal IN can be derived at the output terminal (FIG. 2D). When the output signal OUT is changed from "H" to "L", charges on the capacitor 24 abruptly flow into the $V_{ss}$ potential line, to thereby cause the power source fluctuation. In this case, if a plurality of output signals corresponding to plural-bit data are simultaneously changed, then the power source fluctuation is enhanced.

Further, the output of the second-stage inverter 30 of the delay circuit 27, i.e., potential of a node 62 is changed from "H" to "L" (FIG. 2E) when the delay time of the delay circuit 27 has elapsed after the output signal OUT has changed from "H" to "L". The output of the third-stage inverter 32, i.e., potential of a node 63 is then changed from "L" to "H" (FIG. 2F). In a time period during when the output of the second-stage inverter 30 and the output of the third-stage inverter 32 are set at "H" and "L", respectively, the P-channel transistor 34 and the N-channel transistor 36 are kept in the OFF and ON states respectively according to the output "H" of the second-stage inverter 30, and also the P-channel transistor 38 and the N-channel transistor 42 are kept in the ON and OFF states respectively according to the output "L" of the third-stage inverter 32. As a result, when the output of the second inverter circuit 16 is in the "L" state before inversion, the P-channel transistor 40 is kept in the OFF state since the $V_{cc}$ potential is applied to the gate thereof via the P-channel transistor 38, and also the N-channel transistor 44 is kept in the OFF state since an output "L" of the second inverter circuit 16 is applied to the gate thereof via the N-channel transistor 36. In contrast, when the output of the second inverter circuit 16 is inverted completely to "H" during the delay operation of the delay circuit 27, the N-channel transistor 44 is set into the ON state since an output "H" of the second inverter circuit 16, i.e., potential of a node 65 is applied to the gate thereof via the N-channel transistor 36. The output "L" of the first inverter circuit 14 which has already been inverted is latched (FIG. 2H).

Further, when the output of the second-stage inverter 30 is inverted from "H" to "L" and the output of the third-stage inverter 32 is inverted from "L" to "H" at the time of completion of the delay operation of the delay circuit 27, then the P-channel transistor 34 and N-channel transistor 36 are inverted into the ON and OFF states respectively according to the output "L" of the second-stage inverter 30, and also the P-channel transistor 38 and N-channel transistor 42 are inverted into the OFF and ON states respectively according to the output "H" of the third-stage inverter 32. Therefore, the P-channel transistor 40 is kept in the OFF state since an output "H" of the second inverter circuit 16 is applied to the gate thereof via the P-channel transistor 34. The N-channel transistor 44 is returned to the OFF state since the $V_{ss}$ potential is applied to the gate thereof via the N-channel transistor 42.

Assuming then that the input signal IN is changed from "H" to "L", an operation similar to the above operation is effected. The main points of the operations are explained hereinbelow. When the output of the second inverter circuit 16 is inverted to be "L" level during the delay operation of the delay circuit 27, then the P-channel transistor 40 is inverted into the ON state since an output "L" of the second inverter circuit 16, i.e., potential of a node 64 is applied to the gate thereof via the P-channel transistor 34. An output "H" of the first inverter circuit 14, i.e., potential of the node 60 which has already been inverted is latched (FIG. 2G). Then, after completion of the delay operation, the P-channel transistor 40 is returned to the OFF state since the $V_{cc}$ potential is applied to the gate thereof via the P-channel transistor 38.

FIG. 3 is a circuit diagram showing another arrangement of the conventional output circuit. The output circuit shown in FIG. 3 is similar to the output circuit of FIG. 1 except that the third inverter circuit 18 is omitted, a delay circuit 27' is constructed by four series-connected inverters 50, 28, 30 and 32, and the gates of the P-channel transistor 34 and the N-channel transistor 36 are applied with an output of the third-stage inverter 30. The output of the inverter 30 has an inverted phase of the output of the delay circuit 27'. The same portions of FIG. 3 as those of FIG. 1 are denoted by the same reference numerals and the explanation thereof is therefore omitted.

However, in the conventional output circuits in FIGS. 1 and 3, single-channel type MOS transistors, i.e., P-channel transistor 34 and N-channel transistor 36 are used as transfer gates. The transfer gates transfer to the gates of the transistors 40 and 44 the potentials which selectively turn on the P-channel transistor 40 and N-channel transistor 44 to temporarily latch the input signal IN until the power source fluctuation caused by the change of the outputsignal OUT is suppressed. As a result, if the operation voltage of the power source is lowered, i.e., power source potential $V_{cc}$ is lowered, then the ON-resistances of the transfer gates are increased due to the back-gate bias effect and thus the propagation delays thereof are also increased. This makes it impossible to effect the latching operation at a desired timing as described above. In the worst case, the transfer gates are turned off and desired potentials cannot be transferred to the gates of the MOS transistors 40 and 44.

More particularly, the N-channel transistor 36 transfers not only a low level signal, but also a high level signal, and the P-channel transistor 34 transfers not only a high level signal but also a low level signal. In a case where a high level signal is transferred by means of the N-channel transistor 36, only a signal of a level $V_{cc}-V_{thN}$ which is lowered by the threshold voltage $V_{thN}$ can be transferred. Therefore, as shown in FIG. 2H, the level of a signal "H" cannot be set sufficiently high. When the back-gate bias effect is taken into consideration, the threshold voltage $V_{thN}$ is increased and the level of the transferred signal is further decreased. On the other hand, in a case where a low level signal is transferred by means of the P-channel transistor 34, only a signal of a level $V_{ss}+|V_{thp}|$ which is largely deviated from the level of a desired signal can be transferred. Therefore, as shown in FIG. 2G, the level of a signal "L" cannot be set sufficiently low. Since the signals of the transfer level set by the N-channel transistor 36 and the P-channel transistor 34 are input to gates of the N-channel transistor 44 and the P-channel transistor 40, it becomes difficult for the N-channel transistor 44 and the P-channel transistor 40 to be turned on when the operation voltage of the power source, i.e., power source potential $V_{cc}$ is lowered. Finally the transistors 44 and 40 cannot be turned on. Namely, the power source voltage dependency, by which the minimum operation voltage is limited, occurs.

Thus, the conventional output circuit uses single-channel type MOS transistors as transfer gates for transferring the potentials which turn on selectively the P-channel transistor 40 and the N-channel transistor 44 to temporarily latch the input signal until the power source fluctuation caused by the change of the output signal is suppressed. Therefore, when the operation voltage of the power source is lowered, i.e., power source potential $V_{cc}$ is lowered, the ON-resistances of the transfer gates are increased owing to the back-gate bias effect and the propagation delays of the transfer gates become large. This makes it impossible to effect the latching operation at a desired timing as described above. In the worst case, the transfer gates are turned off, making it impossible to transfer desired potentials.

SUMMARY OF THE INVENTION

The present invention has been made to solve the above drawbacks, and an object of the present invention is to provide a semiconductor integrated circuit having an output circuit, which uses latch circuits for temporarily latching an input signal in a dynamic manner until the power source fluctuation caused by the change of the output signal is suppressed, and which is therefore able to apply bias voltages of sufficient level to the gates of the latch circuits and provide a desired operation characteristic even under a low power source voltage.

A series circuit of the two P-channel transistors and a series circuit of the two N-channel transistors are used respectively as a latch circuit for temporarily latching an input signal until the power source fluctuation caused at the time of change of the output signal is suppressed. The gates of the transistors of the two series-circuits are supplied with both the output signal of the intermediate-stage circuit and the delayed output signal obtained by delaying the above output signal. Hence, the two series circuits are so controlled that either one of the two series-circuits can be turned on to temporarily latch an input signal in a dynamic manner until the power source fluctuation at the time of change of the output signal is suppressed. In this case, since the gate signals to the transistors of the two series-circuits are directly supplied without being passed through single-channel type transfer gates, bias signals of sufficient level are applied to the gates of the latch circuits even under the low power source voltage. Thus, an output circuit capable of providing a desired operation characteristic even under the low operation voltage can be realized.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a block diagram showing the basic arrangement of an output circuit of the present invention;

FIG. 5 is a circuit diagram showing a first embodiment of the output circuit of the present invention;

FIG. 7 is a circuit diagram showing a second embodiment of the output circuit of the present invention;

FIG. 8 is a circuit diagram showing another arrangement of the latch circuit of FIG. 4; and FIG. 9 is a circuit diagram showing still another arrangement of the latch circuit of FIG. 4.

DETAILED DESCRIPTION OF THE PREFERRED EMBODIMENTS

Figure 1:
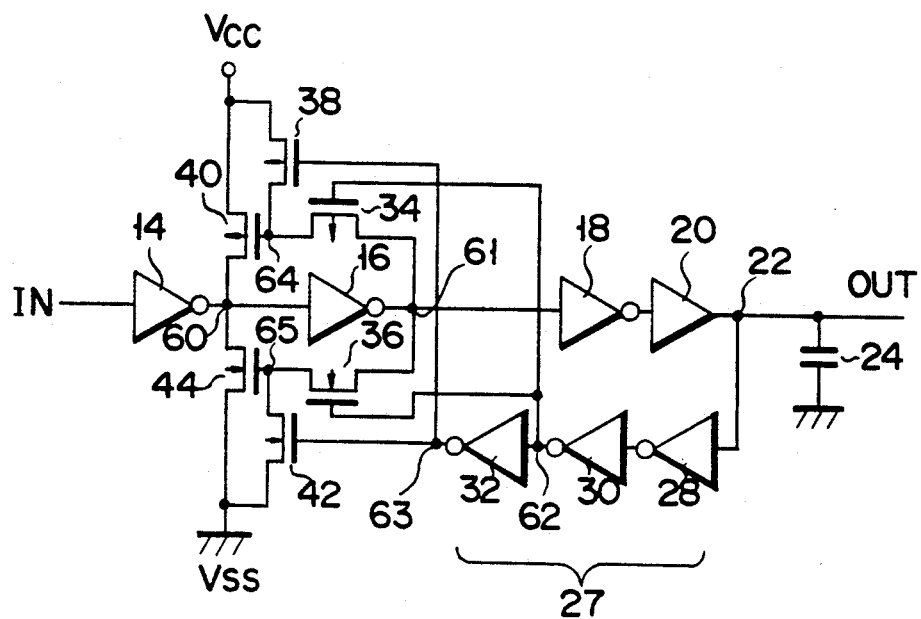
FIG. 1 is a circuit diagram showing an example of the arrangement of a conventional output circuit.

There will now be described embodiments of an output circuit of the present invention with reference to the accompanying drawings.

FIG. 4 is a block diagram showing the basic arrangement of an output circuit of the present invention. In FIG. 4, reference numeral 1 denotes an input-stage circuit for receiving the input signal IN; 2, an intermediate-stage circuit for inverting an output signal of the input-stage circuit 1; and 3, an output-stage circuit for supplying an output signal of the intermediate-stage circuit 2 to an output terminal after or without inverting the output signal of the intermediate-stage circuit 2. These circuits are supplied with a first power source potential, i.e., $V_{cc}$ potential as an operation voltage via a first power source wiring ($V_{cc}$ wiring) and a second power source potential, i.e., $V_{ss}$ potential via a second power source wiring ($V_{ss}$ wiring). Further, reference numeral 4 denotes a first latch circuit which comprises two P-channel transistors P1 and P2 series-connected between the $V_{cc}$ wiring and the output terminal of the input-stage circuit 1; 5, a second latch circuit which comprises two N-channel transistors N1 and N2 series-connected between the $V_{ss}$ wiring and the output terminal of the input-stage circuit 1; and 6, a latch control circuit for supplying both the output signal of the output-state circuit 3 and the delayed signal generated by delaying the above output signal, to the gates of the transistors of the two latch circuits 4 and 5. In FIG. 4, the output signal of the output-stage circuit 3 is inputted to the latch control circuit 6. However, the output signal of the intermediate-stage circuit 2 can, as indicated at 6a, also be used as the input signal of the latch control circuit 6 if predetermined delay times i.e., time periods $t_1-t_2$ and $t_3-t_4$ described later with reference to FIG. 6 can be assured from such output signal by a delay circuit included in the latch control circuit. Further, the input signal of the latch control circuit 6 can also be derived from the intermediate output signal, indicated at 6b, of the output-stage circuit 3.

In the output circuit of FIG. 4, the input-stage circuit 1 may comprise a circuit for outputting an inverted signal or a non-inverted signal of the input signal IN, such as an inverter circuit, NAND circuit, NOR circuit, or the like. Two P-channel transistors in the first latch circuit 4 may be serially connected replaceably with each other. Two N-channel transistors in the second latch circuit 5 may also be serially connected replaceably with each other.

FIG. 5 is a circuit diagram showing the first embodiment of the output circuit of the present invention. A first inverter circuit IV1 constitutes an input-stage circuit which corresponds to the input-stage circuit 1 in FIG. 4. A second inverter circuit IV2 constitutes an intermediate-stage circuit which corresponds to the intermediate-stage circuit 2 in FIG. 4. A third inverter circuit IV3 and an output buffer circuit 20 are cascade-connected to constitute an output-stage circuit which corresponds to the output-stage circuit 3 in FIG. 4. A delay circuit 7 constitutes part of a latch control circuit 6 in FIG. 4 and delays an output signal of an output buffer circuit 20 by a preset period of time. The delay circuit 7 includes an even number of stages of inverter circuits, for example, two stages of inverter circuits IV4 and IV5. The time delay of the delay circuit 7 is set to be slightly longer than a time required for the power source fluctuation to be suppressed to a preset small amplitude. An output signal of the delay circuit 7 is supplied to the gates of the P-channel transistor P2 and the N-channel transistor N2. An output of the second inverter circuit IV2 is supplied to the gates of the P-channel transistor P1 and the N-channel transistor N1. Reference numeral 24 denotes an equivalent capacitor on the output terminal side. Although not shown in FIG. 5, the above circuits are composed of the CMOS transistors, for example, and are supplied with the $V_{cc}$ and $V_{ss}$ potentials. Further, an odd number of stages of inverter circuits can be used as the third inverter circuit IV3 of the output-stage circuit. An odd number of stages of inverter circuits may also be used as the second inverter circuit IV2 of the intermediate-stage circuit.

Figure 6:
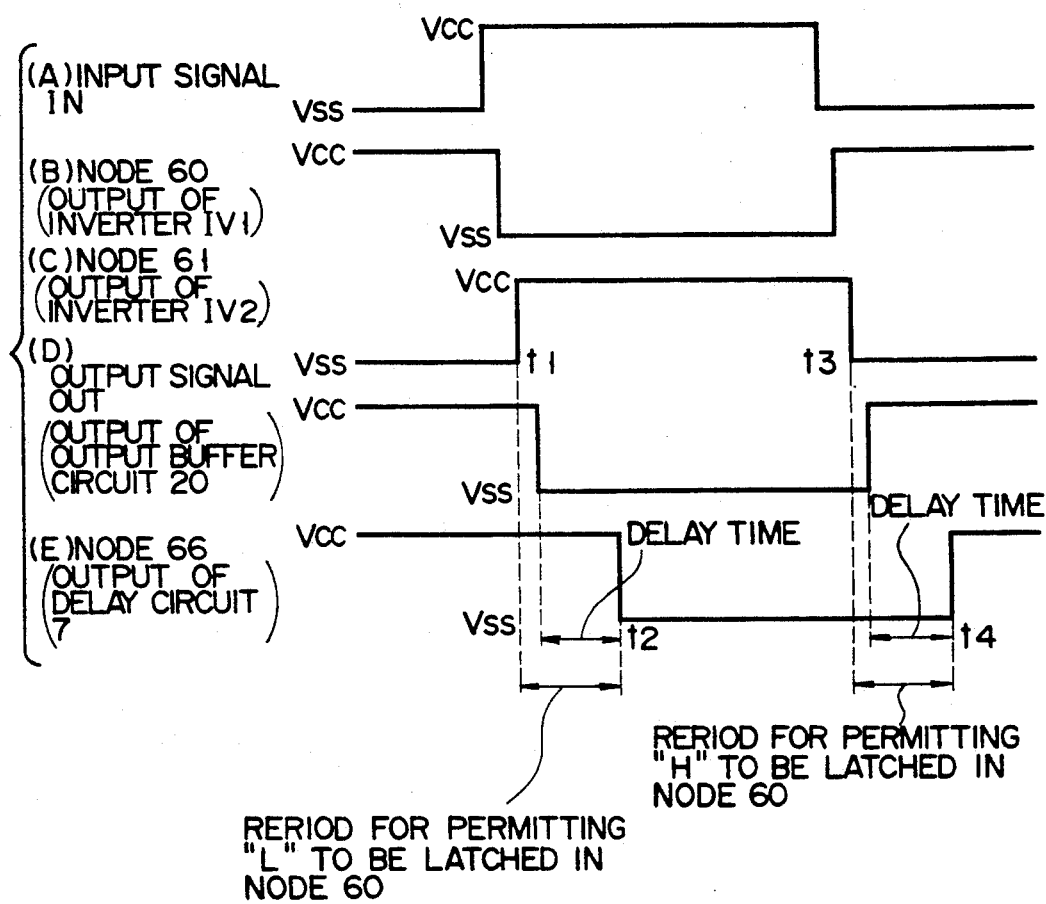
FIG. 6 shows operation waveform diagrams for illustrating the operation of the output circuit of FIG. 5.

Next, the operation of the output circuit of FIG. 5 will be described with reference to FIG. 6.

An input signal IN is inputted from a different integrated circuit or the same integrated circuit. Assume now that the input signal IN is in the "L" state, for example, then the output of the first inverter circuit IV1, i.e., potential of the node 60 is set at "H", the output of the second inverter circuit IV2, i.e., potential of the node 61 is set at "L", and the output of the third inverter circuit IV3 is set at "H". Therefore, an output of level "H" corresponding to the inverted level of the input signal IN is derived as an output OUT of the output buffer circuit 20, i.e., potential of the output terminal 22. An output of the delay circuit 7 is also set at "H". The P-channel transistor P1 and the N-channel transistor N1 are set in the ON and OFF states respectively according to the output "L" of the second inverter circuit IV2. Further, the P-channel transistor P2 and the N-channel transistor N2 are set in the OFF and ON states respectively according to the output "H" of the delay circuit 7.

Assume then that the input signal IN is changed from "L" to "H" (FIG. 6A), the output of the first inverter circuit IV1, i.e., potential of the node 60 is inverted from "H" to "L" (FIG. 6B), the output of the second inverter circuit IV2, i.e., potential of the node 61 is inverted from "L" to "H" at a time $t_1$ (FIG. 6C), and the output of the third inverter circuit IV3 is inverted from "H" to "L". The output of the output buffer circuit 20, i.e., potential of the node 22 is inverted from "H" to "L". Thus the output signal OUT of "L" level corresponding to an inverted level of the input signal IN is derived (FIG. 6D). At the time of a change of the output signal OUT from "H" to "L", charges on the capacitor 24 abruptly flow into the $V_{ss}$ potential line, causing the power source fluctuation.

However, the output of the delay circuit 7, i.e., potential of the node 66 is changed from "H" to "L" when the delay time of the delay circuit 7 has elapsed after the time when the output signal OUT is changed from "H" to "L" (FIG. 6E). As a result, the P-channel transistor P2 and the N-channel transistor N2 are kept in the OFF and ON states respectively in the delayed period of time during when the output of the delay circuit 7 is set at "H". Therefore, when the output of the second inverter circuit IV2 is inverted completely to "H" during the delay operation of the delay circuit 7, the P-channel transistor P1 and the N-channel transistor N1 are inverted into the OFF and ON states respectively. As a result, the P-channel transistors P1 and P2 of the first latch circuit 4 are both set into the OFF state, and the N-channel transistors N2 and N1 of the second latch circuit 5 are both set into the ON state. Therefore, the output "L" of the first inverter circuit IV1, i.e., potential of the node 60 which has already been inverted can be dynamically latched.

Further, when the delay operation of the delay circuit 7 is terminated at a time $t_2$, the inversion of the output of the delay circuit 7 from "H" to "L" is completed (FIG. 6E). As a result, the P-channel transistor P2 and the N-channel transistor N2 are set into the ON and OFF states respectively according to the output "L" of the delay circuit 7, so that the second latch circuit 5 will be returned to the OFF state. During the time period from the time $t_1$ to the time $t_2$, the potential of the node 60 is still latched at "L".

Assume next that the input signal IN is changed from "H" to "L" (FIG. 6A), the operations are effected in a manner similar to the above-described operations. The main points of the operations are described below. When the input signal IN is at "H" level, the P-channel transistor P2 is set in the ON state. When the output of the second inverter circuit IV2 has been inverted during the delay operation of the delay circuit 7 (FIG. 6C), the P-channel transistor P1 is inverted to the ON state, and the first latch circuit 4 (P-channel transistors P1 and P2) are set into the ON state. Hence, "H" of the output of the first inverter circuit IV1 (node 60) which has already been inverted may be dynamically latched (FIG. 6E). Then, after completion of the delay operation, the P-channel transistor P2 is inverted into the OFF state according to the output "H" of the delay circuit 7. The first latch circuit 4 will thus be returned to the OFF state. During the time period from the time $t_3$ to the time $t_4$, the potential of the node 60 is still latched at "H".

In the output circuit of FIG. 5 as described above, a series circuit of two P-channel transistors and a series circuit of two N-channel transistors are used as the latch circuits 4 and 5 for temporarily latching an input signal until the power source fluctuation caused by the change of the output signal is suppressed. The gates of the two transistors of each of the two series circuits are supplied with the output signal of the intermediate-stage circuit 2 and the delayed output signal obtained by delaying the output signal of the circuit 2. The two series circuits are therefore so controlled that either one of the two series circuits can be set into the ON state to temporarily latch the input signal in a dynamic manner until the power source fluctuation at the time of change of the output signal is suppressed. In this case, since the gate signals of the transistors of the two series circuits are directly supplied without being passed through single-channel type transfer gates, sufficiently large biases can be applied to the gates of the latch circuits and a desired operation characteristic can be attained even under the low power source voltage.

FIG. 7 is a circuit diagram showing a second embodiment of the output circuit of the present invention. The output circuit is similar to the output circuit of FIG. 5 except an output-stage circuit and a delay circuit 7a of the latch control circuit. The same portions as those of FIG. 5 are denoted by the same reference numerals. The output-stage circuit includes only an output buffer circuit 20. The delay circuit 7a of the latch control circuit includes an odd number of stages of inverters, for example, three stages of inverters IV4 to IV6 which invert the output signal of the buffer circuit 20 and delay the output signal by a preset period of time.

The operation of the output circuit of FIG. 7 is different from that of the output circuit of FIG. 5 in that a signal of the same level as the input signal IN appears at the output of the output buffer circuit 20. The other operations are effected in the same manner and the same effects can be obtained.

Figure 3:
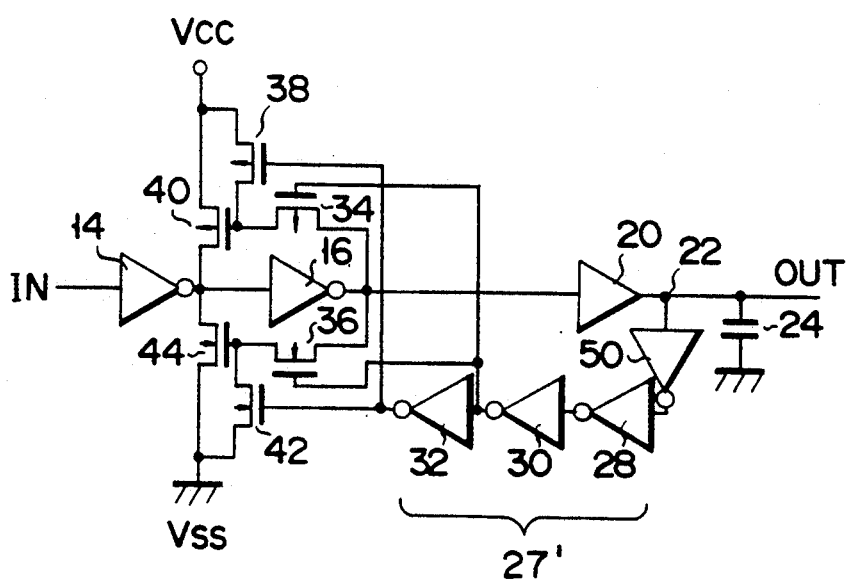
FIG. 3 is a circuit diagram showing another example of the arrangement of the conventional output circuit.
Figure 2:
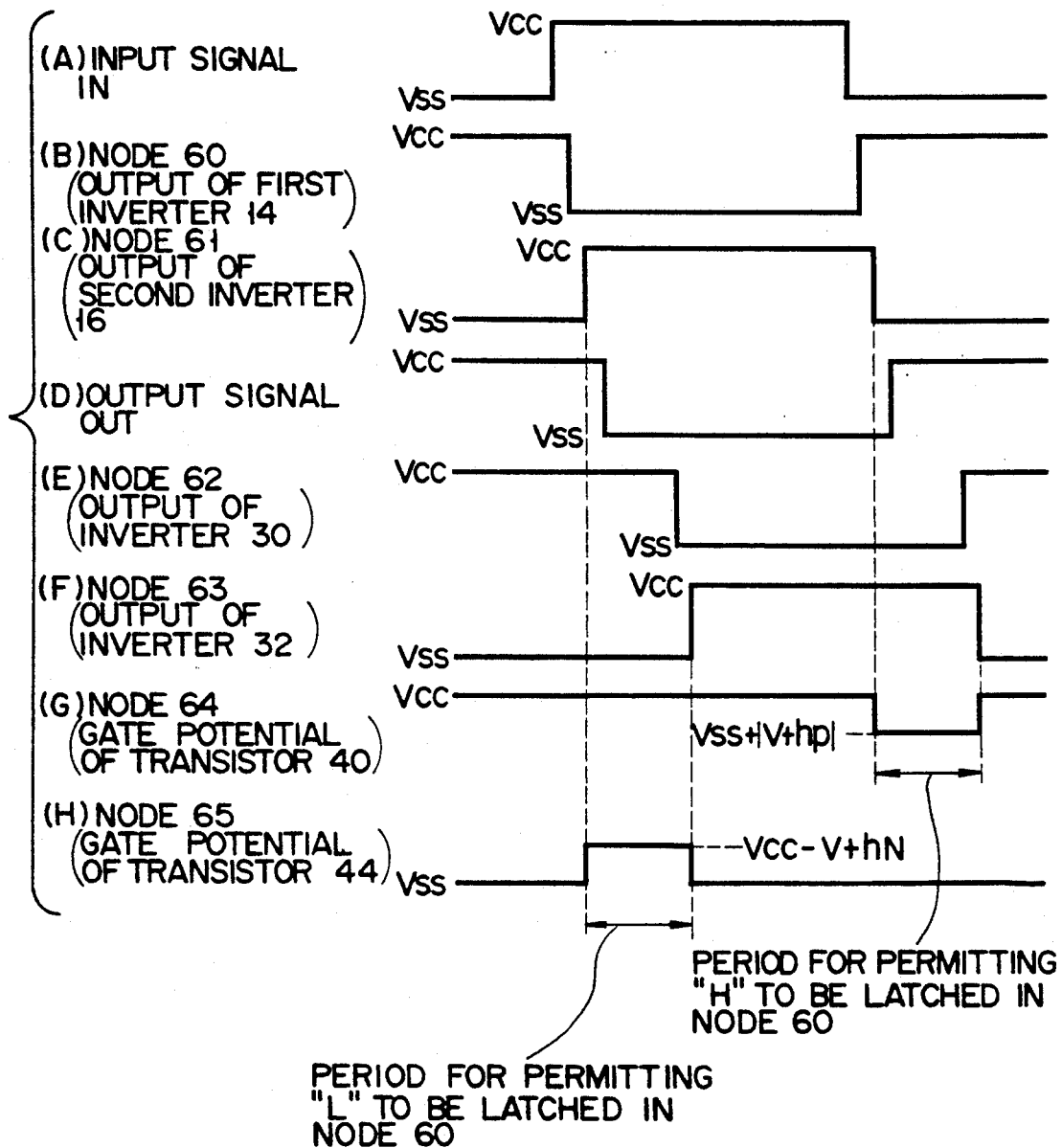
FIG. 2 shows operation waveform diagrams for illustrating the operation of the output circuit of FIG. 1.

Further, in a case where the input signal is temporarily latched until the power source fluctuation at the time of change of the output signal is suppressed, it is impossible to receive succeeding input signals after the present input signal has been changed and an output of the delay circuit is determined. However, according to the output circuits of FIGS. 5 and 7, the number of gate stages of the delay circuit can be reduced by one in comparison with the conventional delay circuits of FIGS. 1 and 3. Hence, a period of time after which the succeeding input signal can be received can be shortened, the maximum operation frequency can be made higher, and the operation speed can be enhanced.

FIGS. 8 and 9 are circuit diagrams showing different arrangements of the latch circuit of FIG. 4. In FIG. 8, the first and second latch circuits 4 and 5 are each constructed by three MOS transistors. In FIG. 9, the first and second latch circuits 4 and 5 are each constructed by four MOS transistors. The operation thereof is the same as that described above and the explanation thereof is omitted.

As described above, according to this invention, it is possible to provide a semiconductor integrated circuit having an output circuit, which uses a latch circuit for temporarily latching an input signal in a dynamic manner until the power source fluctuation caused by the change of the output signal is suppressed, and which is therefore able to apply sufficiently large biases to the gates of the latch circuits and provide a desired operation characteristic even under the low power source voltage. Further, the number of gate stages of the delay circuit in the latch control circuit can be reduced by one in comparison with the conventional delay circuit so that a period of time after which the succeeding input signal can be received can be shortened, the maximum operation frequency can be made higher, and the operation speed can be enhanced.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

What is claimed is:

1. A semiconductor integrated circuit comprising:
   a power source having first and second power source wirings, for supplying an operation voltage to respective circuits;
   an input-stage circuit for receiving an input signal;
   an intermediate-stage circuit for inverting an output signal of said input-stage circuit;
   an output-stage circuit for supplying either an inverted or a non-inverted signal of an output signal of said intermediate-stage circuit to an output terminal;
   a first latch circuit having at least two P-channel transistors serially connected between said first power source wiring and an output terminal of said input-stage circuit;
   a second latch circuit having at least two N-channel transistors serially connected between said second power source wiring and the output terminal of said input-stage circuit; and
   a latch control circuit for supplying said output signal of said intermediate-stage circuit and a delayed output signal of said output-stage circuit respectively to gates of said at least two transistors of each of said first and second latch circuits.

2. A semiconductor integrated circuit according to claim 1, wherein said output-stage circuit comprises an inverter circuit of an odd number of inverter stages for inverting said output signal of said intermediate-stage circuit and an output buffer circuit for buffer-amplifying and outputting an output signal of said inverter circuit to said output terminal; and said latch control circuit comprises a delay circuit for delaying said output signal of said output-stage circuit by a preset period of time and supplies said output signal of said intermediate-stage circuit and an output signal of said delay circuit respectively to gates of said at least two transistors of each of said first and second latch circuits.

3. A semiconductor integrated circuit according to claim 1, wherein said output-stage circuit comprises an inverter circuit of an odd number of inverter stages for inverting said output signal of said intermediate-stage circuit and an output buffer circuit for buffer-amplifying and outputting an output signal of said inverter circuit to said output terminal; and said latch control circuit comprises a delay circuit for inverting and delaying said output signal of said output-stage circuit by a preset period of time, and supplies said output signal of said intermediate-stage circuit and an output signal of said delay circuit respectively to gates of said at least two transistors of each of said first and second latch circuits.

4. A semiconductor integrated circuit comprising:
   a power source having first and second power source wirings, for supplying an operation voltage to respective circuits;
   an input-stage circuit for receiving an input signal;
   an intermediate-stage circuit for inverting an output signal of said input-stage circuit;
   an output-stage circuit for supplying either an inverted or a non-inverted signal of an output signal of said intermediate-stage circuit to an output terminal;
   a first latch circuit having at least two P-channel transistors serially connected between said first power source wiring and an output terminal of said input-stage circuit;
   a second latch circuit having at least two N-channel transistors serially connected between said second power source wiring and the outcome terminal of said input-stage circuit; and
   a latch control circuit for supplying said output signal of said intermediate-stage circuit and a delayed output signal of said intermediate-stage circuit respectively to gates of said at least two transistors of each of said first and second latch circuits.

5. A semiconductor integrated circuit according to claim 4, wherein said output stage circuit comprises an inverter circuit for an odd number of inverter stages for inverting said output signal of said intermediate stage circuit and an output buffer circuit for buffer-amplifying and outputting an output signal of said inverter circuit to said output terminal; and said latch control circuit comprises a delay circuit for delaying said output signal of said intermediate-stage circuit by a preset period of time and supplies said output signal of said intermediate-stage circuit and an output signal of said delay circuit respectively to gates of said at least two transistors of each of said first and second latch circuits.

6. A semiconductor integrated circuit according to claim 4, wherein said output-stage circuit comprises an inverter circuit of an odd number of inverter stages for inverting said output signal of said intermediate-stage circuit and an output buffer circuit for buffer-amplifying and outputting an output signal of said inverter circuit to said output terminal; and said latch control circuit comprises a delay circuit for inverting and delaying said output signal of said intermediate-stage circuit by a preset period of time, and supplies said output signal of said intermediate-stage circuit and an output signal of said delay circuit respectively to the gates of said at least two transistors of each of said first and second latch circuits.

7. A semiconductor integrated circuit comprising:
   a power source having first and second power source wirings, for supplying an operation voltage to respective circuits;
   an input-stage circuit for receiving an input signal;
   an intermediate-stage circuit for inverting an output signal of said input-stage circuit;
   an output-stage circuit for supplying either an inverted or a non-inverted signal of an output signal of said intermediate-stage circuit to an output terminal;

a first latch circuit having at least two P-channel transistors serially connected between said first power source wiring and an output terminal of said input-stage circuit;

a second latch circuit having at least two N-channel transistors serially connected between said second power source wiring and the output terminal of said input-stage circuit; and a latch control circuit for supplying said output signal of said intermediate-stage circuit and a delayed output signal of an intermediate output signal of said output-stage circuit respectively to gates of said at least two transistors of each of said first and second latch circuits.

8. A semiconductor integrated circuit according to claim 7, wherein said output stage circuit comprises an inverter circuit of an odd number of inverter stages for inverting said output signal of said intermediate-stage circuit and an output buffer circuit for buffer-amplifying and outputting an output signal of said inverter circuit to said output terminal; and said latch control circuit comprises a delay circuit for delaying said intermediate output signal of said output-stage circuit by a preset period of time and supplies said output signal of said intermediate-stage circuit and an output signal of said delay circuit respectively to gates of said at least two transistors of each of said first and second latch circuits.

9. A semiconductor integrated circuit according to claim 7, wherein said output-stage circuit comprises an inverter circuit of an odd number of inverter stages for inverting said output signal of said intermediate-stage circuit and an output buffer circuit for buffer-amplifying and outputting an output signal of said inverter circuit to said output terminal; and said latch control circuit comprises a delay circuit for inverting and delaying said intermediate output signal of said output-stage circuit by a preset period of time, and supplies said output signal of said intermediate-stage circuit and an output signal of said delay circuit respectively to gates of said at least two transistors of each of said first and second latch circuits.

* * * * *

UNITED STATES PATENT AND TRADEMARK OFFICE
CERTIFICATE OF CORRECTION

PATENT NO. : 5,220,205
DATED : June 15, 1993
INVENTOR(S) : Hiroshi SHIGEHARA et al.

It is certified that error appears in the above-indentified patent and that said Letters Patent is hereby corrected as shown below:

Abstract, title page, line 15, before "sufficiently" delete --a--.

Signed and Sealed this

Eleventh Day of October, 1994

Attest:

BRUCE LEHMAN

Attesting Officer     Commissioner of Patents and Trademarks